United States Patent

Tange et al.

[11] Patent Number: 5,733,829
[45] Date of Patent: Mar. 31, 1998

[54] PROCESS FOR THE PRODUCTION OF SILICON CARBIDE OR SILICON NITRIDE WHISKERS

[75] Inventors: Yoshihiro Tange, Marugame; Shinji Otoishi, Kagawa-ken; Hideaki Matsuda, Marugame, all of Japan

[73] Assignee: Okura Industrial Co., Ltd., Japan

[21] Appl. No.: 603,223

[22] Filed: Feb. 20, 1996

[30] Foreign Application Priority Data

Feb. 23, 1995 [JP] Japan ................ 7-035401
May 15, 1995 [JP] Japan ................ 7-139913
Nov. 1, 1995 [JP] Japan ................ 7-308209

[51] Int. Cl.$^6$ ................ C04B 35/565; C04B 35/584
[52] U.S. Cl. ................ 501/95.1; 501/88; 501/96.2; 501/97.1; 423/344; 423/345
[58] Field of Search ................ 501/95.1, 96.2, 501/88, 97.1; 423/344, 345

[56] References Cited

U.S. PATENT DOCUMENTS

| | | | |
|---|---|---|---|
| 4,500,504 | 2/1985 | Yamamoto | 501/95.1 |
| 4,604,273 | 8/1986 | Czupryna et al. | 501/95.1 |
| 4,788,049 | 11/1988 | Long et al. | 423/344 |
| 4,975,392 | 12/1990 | Yamada et al. | 501/95.1 |
| 5,334,565 | 8/1994 | Takita et al. | 501/95.1 |

*Primary Examiner*—Karl Group
*Attorney, Agent, or Firm*—Lorusso & Loud

[57] ABSTRACT

A process for the production of silicon-containing ceramic whiskers is disclosed which includes the steps of:

(a) forming a solid body of a mixture including an organosilicon polymer having a number average molecular weight of 500–50,000 and having a skeleton consisting of silicon atoms or silicon atoms and carbon atoms, and carbon; and (b) pyrolyzing the solid body in a noble gas atmosphere or a nitrogen gas atmosphere to form silicon carbide or silicon nitride whiskers.

16 Claims, 2 Drawing Sheets

PROCESS FOR THE PRODUCTION OF SILICON CARBIDE OR SILICON NITRIDE WHISKERS

BACKGROUND OF THE INVENTION

This invention relates to a process for the preparation of whiskers of silicon carbide or silicon nitride.

Silicon carbide or nitride whiskers are needle-like single crystals having high resistance to heat and chemicals and excellent mechanical strengths and are utilized as a reinforcing material for plastics, metals and ceramics.

The following methods have been proposed for the production of silicon carbide whiskers: a method in which a silicon halide is reacted with a hydrocarbon; a method in which an organosilicon compound such as methylchlorodisilane is reacted in an oven; a method in which a mixture of silicon dioxide with carbon is reacted at a high temperature; a method in which a mixture of rice hulls with carbon black is reacted at a high temperature. Silicon carbide whiskers obtained by these methods are not satisfactory in quality.

One known method for producing silicon nitride whiskers includes heat treating powder or spun fibers of a polycarbosilane in an ammonical atmosphere. This method is disadvantageous because of the use of ammonia gas. Another method for producing silicon nitride whiskers includes decomposing polysilastyrene copolymer or polysilastyrene at a high temperature in nitrogen stream in the presence of a small amount of oxygen. This method has a problem because it is difficult to control the amount of oxygen and because the whisker production efficiency is very low since the surface area of the polymer, on which the whisker product is formed, is smaller than 100 m²/kg.

SUMMARY OF THE INVENTION

It is, therefore, an object of the present invention to provide a simple economical process for producing high purity silicon nitride or silicon carbide whiskers.

In accordance with the present invention, there is provided a process for the production of silicon-containing ceramic whiskers, wherein a solid body of a mixture of an organosilicon polymer having a number average molecular weight of 500–50,000 and having a skeleton consisting of silicon atoms or silicon atoms and carbon atoms with carbon is subjected to pyrolysis in a noble gas atmosphere or a nitrogen gas atmosphere.

BRIEF DESCRIPTION OF THE DRAWINGS

Other objects, features and advantages of the present invention will become apparent from the detailed description of the preferred embodiments of the invention which follows, when considered in light of the accompanying drawings in which.

DETAILED DESCRIPTION OF THE PREFERRED EMBODIMENTS OF THE INVENTION

Figure 1:
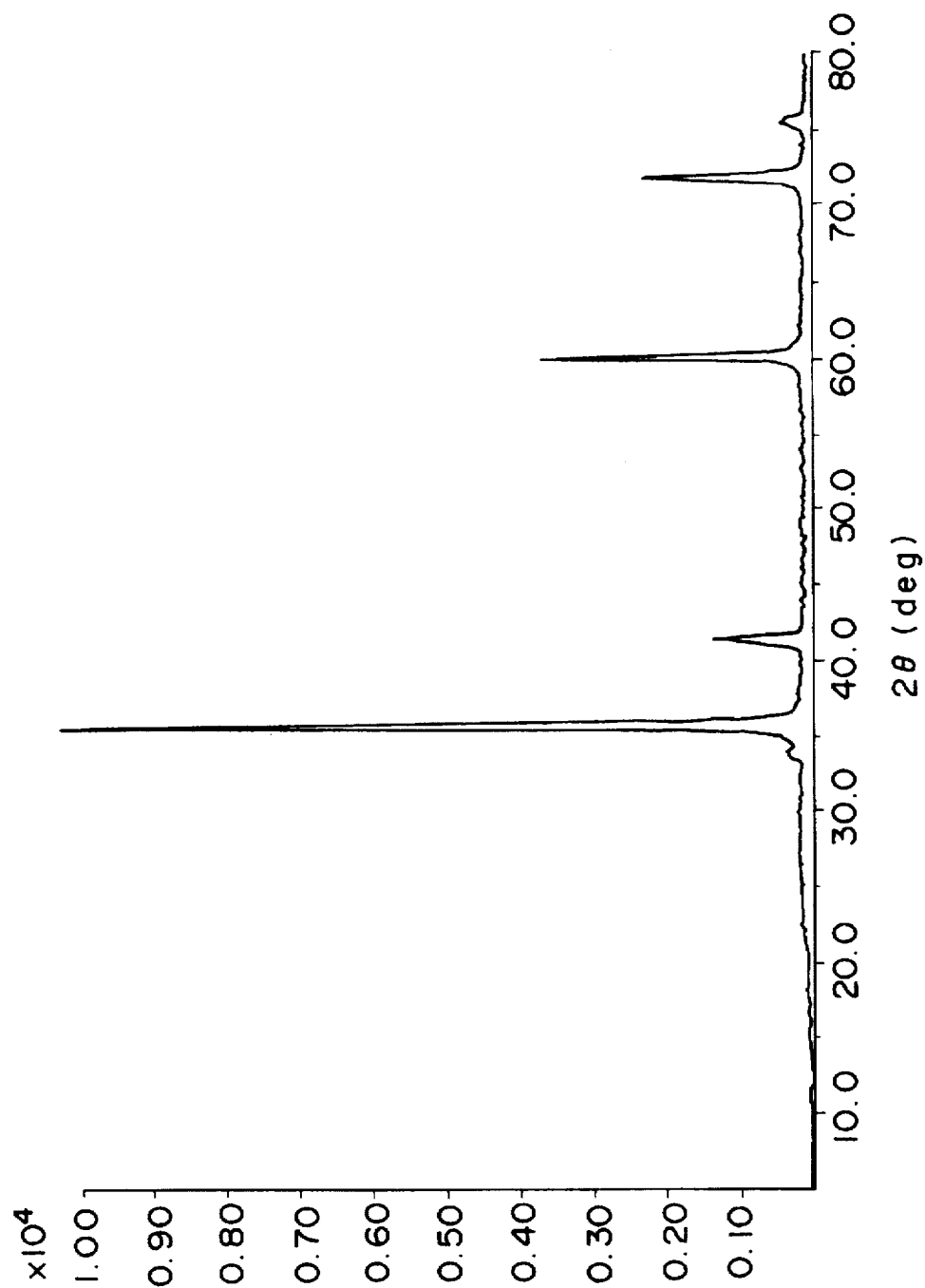
FIG. 1 is a powder X-ray diffraction pattern of silicon carbide whisker obtained in Example 1.

In the present invention, an organosilicon polymer having a skeletal structure composed only of silicon atoms or composed only of silicon and carbon atoms is used. The typical example of the organosilicon polymer having a skeleton composed only of silicon atoms is a polysilane containing a recurring unit of the formula:

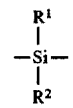

wherein $R^1$ and $R^2$ each represent a hydrogen atom, a lower alkyl group or an aryl group. Polysilastyrene of the formula (I):

wherein m and n are each an integer, is an example of the polysilane.

The typical example of the organosilicon polymer having a skeleton composed only of silicon and carbon atoms is a polycarbosilane having a recurring unit of the formula:

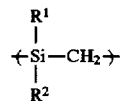

wherein $R^1$ and $R^2$ each represent a hydrogen atom, a lower alkyl group or an aryl group. An example of the polycarbosilane is as shown by the formula (II):

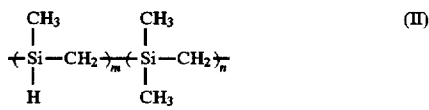

wherein m and n are each an integer.

The organosilicon polymer has a number average molecular weight of 500–50,000, preferably 1,000–30,000. When the number average molecular weight is less than 500, the organosilicon polymer is apt to be vaporized during the heat treatment so that the yield of the whisker product is lowered. On the other hand, too large a number average molecular weight of the organosilicon polymer in excess of 50,000 causes difficulties in forming a homogeneous mixture of the organosilicon polymer with carbon.

The carbon to be mixed with the organosilicon polymer may be in any desired form such as a fiber, powder or particle and may be, for example, carbon fibers, graphite fibers, carbon black powder, activated carbon powder, char powder, coke powder or graphite powder. The use of fibrous carbon, especially chopped or milled fibrous carbon having a length of 0.05–50 mm is preferred for reasons of prevention of shrinkage during the heat treatment stage. Carbon is generally used in an amount of 20–1,000 parts by weight, preferably 50–600 parts by weight per 100 parts by weight of the organosilicon polymer.

If desired, a metal or a metal compound (such as an oxide, a halide, a nitrate or a carbonate) may be incorporated into the solid body of a mixture of the organosilicon polymer with carbon as a catalyst for enhancing the formation of silicon-containing ceramic whiskers. Illustrative of suitable metals are Fe, Co, Ni, Mn, Cu, W and Al.

The solid body of a mixture of the organosilicon polymer with carbon may be any desired shape such as a block, a tube, a plate, a sheet, a pellet, a ball or a bar. It is referred that the solid body be in the form of a porous body when subjected to the pyrolysis for the formation of whiskers. The porosity of the porous body is preferably 35–80%, more preferably 40–70%, for reasons of availability of sufficient space for the formation of ceramic whiskers.

The following methods can be adopted for the formation of such a porous body:

(A) A method in which the organosilicon polymer and carbon are further mixed with a polymerizable vinyl group-containing compound and a polymerization initiator, the resulting blend being polymerized. Although the polymerized product is not porous, the polymer of the vinyl group-containing compound is decomposed and gasified during the subsequent pyrolysis step to leave a porous body. If desired, however, the polymerized product in the form of a porous body may be obtained by any suitable known method such as a solvent-soluble substance is incorporated into the blend, the solvent-soluble substance being removed by washing with the solvent after the polymerization, a method in which a blowing agent is incorporated into the blend, or a method in which air bubbles are incorporated into the blend by vigorous mixing or bubbling.

(B) A method in which the organosilicon polymer and carbon are further mixed with a polymerizable vinyl group-containing compound, a polymerization initiator, an emulsifying agent and water, the resulting blend being homogeneously mixed to form W/O (water particles in oil phase) emulsion, followed by polymerization of the polymerizable compound and removal of the water by evaporation, thereby giving a porous body.

(C) A method in which the organosilicon polymer and carbon are further mixed with a solvent for the polymer, the resulting mixture being thereafter treated for the removal of the solvent to form a porous body.

(D) A method in which the organosilicon polymer and carbon are further mixed with an organic binder such as a thermoplastic resin, starch or gelatin, and optionally a solvent such as water, the resulting mixture being heated to dissolve or fuse the binder and, thereafter, cooled to solidify the mixture. Although the solidified product is not porous, the binder is decomposed during the succeeding pyrolysis step to leave a porous body. If desired, however, the solidified product in the form of a porous body may be obtained by any suitable known method such as described previously.

Above all, the method (A)–(C) are preferably adopted. These methods are described in detail below.

Method (A):

The polymerizable vinyl group-containing compound may be, for example, a styrene compound such as styrene, α-methylstyrene or divinyl benzene; acrylic acid, methacrylic acid, or an ester thereof such as methyl (meth) acrylate, ethylene glycol di(meth)acrylate or trimethylolpropane tri(meth)acrylate; diallyl phthalate; and a unsaturated polyester. These vinyl group-containing compounds may be polymerized through radical polymerization or redox polymerization and can serve as a solvent for the organosilicon polymer. The use of a styrene compound is particularly preferred since the styrene compound is a good solvent for the organosilicon polymer and since a polymer thereof can be converted into gaseous components with a low carbonization yield during the pyrolysis, so that a porous body can be easily formed. The polymerizable vinyl group-containing compound is generally used in an amount of 100–2,000 parts by weight, preferably 300–1,300 parts by weight per 100 parts by weight of the organosilicon polymer.

The polymerization initiator may be, for example, a peroxide-type radical polymerization initiator such as benzoyl peroxide, lauroyl peroxide, t-butylperoxyoctoate, p-menthan hydroxyperoxide, dimyristylperoxy dicarbonate or 1,1-bis(t-butylperoxy)cyclohexane; an azo-type radical polymerization initiator such as azobisisobutylonitrile or azobis-2,4-dimethylvalelonitrile; or a redox polymerization initiator obtained from the above radical polymerization initiator and an amine or an organometallic compound. The polymerization initiator is generally used in an amount of 0.05–5 parts by weight per 100 parts by weight of the polymerizable vinyl group-containing compound.

It is preferred that the blend of the organosilicon polymer, carbon, the polymerizable vinyl group-containing compound and the polymerization initiator additionally contain a polymeric material soluble in the vinyl group-containing polymerizable compound, since the viscosity of the blend is increased so that the carbon is prevented from precipitating and is maintained in homogeneously dispersed state. Illustrative of suitable polymeric materials are a styrene resin, a petroleum resin, a cumarone resin, a diallylphthalate resin and a methacrylic resin.

The blend is heated to polymerize the vinyl group-containing compound to obtain a solid body. The polymer of the vinyl group-containing compound is decomposed during the succeeding pyrolysis step so that the solid body becomes porous suitable for forming silicon-containing ceramic whiskers. The polymerization temperature varies with the kinds of the vinyl group-containing compound and the polymerization initiator but is generally in the range of 40°–100° C.

Method (B):

The vinyl group-containing polymerizable compound and the polymerization initiator used above-described Method (A) may also be used in this method. Further, a water-soluble polymerization initiator such as hydrogen peroxide, ammonium persulfate or potassium persulfate may be suitably used in Method (B). The amounts of the vinyl group-containing polymerizable compound and the polymerization initiator are also the same as in Method (A).

Emulsifiers customarily used for the formation of W/O-type emulsion may be suitably employed for the purpose of the present invention. Surfactants having an H. L. B. value of 3.5–6.0 may be preferably used. Specific examples of such emulsifiers include sorbitan sesquioleate, sorbitan monooleate, sorbitan monostearate, glycerol stearate and polyglycerol oleate. The emulsifier is generally used in an amount of 10–50 parts by weight, preferably 20–30 parts by weight, per 100 parts by weight of the vinyl group-containing polymerizable compound. The amount of water is generally 100–1,400 parts by weight, preferably 180–1,200 parts by weight, per 100 parts by weight of the vinyl group-containing polymerizable compound. The porosity of the porous body greatly depends upon the water content in the W/O emulsion.

A blend containing the above-described organosilicon polymer, carbon, polymerizable vinyl group-containing compound, polymerization initiator, emulsifying agent and water, is homogeneously mixed using a suitable mixer, such as a stirrer with stirring blades, a ball mill, a colloid mill, a kneader or a screw extruder, to form the W/O emulsion. The emulsion is then heated to polymerize the polymerizable vinyl group-containing compound. It is advisable to carry out the polymerization at below 100° C., since otherwise the emulsion becomes unstable due to the considerable evaporation of water. The polymerized product is subsequently dried to vaporize the water contained therein and to obtain a porous body. The drying may be carried out by hot air drying, vacuum drying, lyophilization or an oven.

The Method (B) can produce a porous body having a high porosity so that the specific surface area thereof is very high (100–10,000 m²/kg). Moreover, the pores are uniform in size and are uniformly distributed. As a consequence, silicon-containing ceramic whiskers having a uniform size can be produced with a high yield. The polymer of the vinyl group-containing compound is decomposed during the pyrolysis step so that the porosity is further increased.

Method (C):

Examples of the solvent used in this method for dissolving the organosilicon polymer include aromatic hydrocarbons such as xylene, toluene and benzene; aliphatic halogenated hydrocarbons such as chloroform, carbon tetrachloride, 1,1,1-trichloroethane and 1,1,2,2-tetrachloroethane; ethers such as ethyl ether and tetrahydrofuran; and aliphatic hydrocarbons such as hexane.

The carbon is mixed or impregnated with the solvent solution of the organosilicon polymer and the resulting mixture is treated to vaporize the solvent, thereby to leave a porous body.

The solid body of a mixture containing the organosilicon polymer and carbon is subjected to pyrolysis in a noble gas (e.g. argon, neon or helium) atmosphere or a nitrogen gas atmosphere at a temperature sufficient to form silicon-containing ceramic whiskers. When the pyrolysis is performed in a noble gas atmosphere, silicon carbide whiskers are obtained. In this case, the pyrolysis temperature is preferably 1,100°–1,550° C., more preferably 1,200°–1,500° C. Argon is preferably used as the noble gas. When the pyrolysis is performed in a nitrogen gas atmosphere, silicon nitride whiskers are formed. In this case, the pyrolysis temperature is preferably 1,100°–1,600° C., more preferably 1,300°–1,500° C. The silicon-containing ceramic whiskers deposit on the surfaces of the carbon and grow as the pyrolysis proceeds.

When the solid body contains an organic substance such as a binder or a polymer of the vinyl group-containing compound, a preheat-treatment is preferably carried out to decompose such an organic substance. The pretreatment is performed by gradually increasing the temperature up to 500°–900° C., preferably 500°–600° C., in a nitrogen or noble gas atmosphere. By this pretreatment almost all of the organic substance is decomposed and gasified, whereas the decomposition of the organosilicon polymer does not vigorously proceed though the side chains thereof begin decomposing. Thus, a porous body is formed in which the carbon particles or fibers are interbonded by the organosilicon polymer. When the solid body already has an open porous structure before the pretreatment (as produced by Method (B)), the gasification of the organic substance is accelerated since the decomposition gas can easily get out of the solid body through the open pores. In the subsequent pyrolysis step, whiskers are formed not only within the pores of the porous body but also on the surface of the porous body.

As a result of the pyrolysis of the solid body of the organosilicon polymer and carbon, silicon-containing ceramic whiskers are obtained as a mixture with carbon. The carbon may be burnt and removed from the mixture by heating the mixture in air, thereby giving silicon-containing ceramic whiskers.

The following examples will further illustrate the present invention. Parts are by weight.

EXAMPLE 1

In 333 parts of styrene were dissolved 100 parts of polycarbosilane (number average molecular weight: about 2,500, manufactured by Nippon Carbon K. K., having a structure shown by the above formula (II)) and the resulting solution was placed in a polyethylene vessel together with 37 parts of trimethylolpropane trimethacrylate (hereinafter referred to as TMPT), 470 parts of milled carbon fiber (derived from pitch, manufactured by Nippon Plate Glass Co., Ltd.) and 3.7 parts of benzoyl peroxide (hereinafter referred to as BPO). The contents in the vessel were then thoroughly mixed with a stirrer. The mixture was then poured into a tubular glass vessel and heated at 60° C. for 24 hours to polymerize the styrene and TMPT and to obtain a solid body in a columnar shape.

The solid body was taken out of the vessel and placed in a degreasing chamber. While continuously feeding nitrogen gas to the chamber at a rate of 1 liter per minute, the solid body was gradually heated to 550° C. and maintained at that temperature for 4 hour to decompose the BPO and the polymer of styrene and TMPT. The resulting product was then placed in an oven. While argon was continuously fed to the oven at a rate of 0.5 liter per minute, the pretreated product was pyrolyzed at 1,400° C. for 5 hours. The pyrolyzed product was then heated at 650° C. in air to burn the carbon fiber to leave a light green product. The scanning electric microscopy revealed that the product was in the form of whisker having a length of 10–25 μm and a diameter of 0.2–0.4 μm. The X-ray diffraction pattern of the whisker is shown in FIG. 1, from which the whisker is identified as being crystalline β-SiC.

EXAMPLE 2

In 900 parts of styrene were dissolved 100 parts of polysilastyrene (number average molecular weight: about 2,000, manufactured by Wako Junyaku K. K., having a structure shown by the above formula (I)) and the resulting solution was placed in a polyethylene vessel together with 100 parts of TMPT, 200 parts of milled carbon fiber (derived from pitch, manufactured by Nippon Plate Glass Co., Ltd.), 10 parts of BPO and 400 parts of polystyrene. The contents in the vessel were then thoroughly mixed with a stirrer. The mixture was processed in the same manner as that in Example 1 except that the pyrolysis temperature was decreased to 1,350° C. The scanning electric microscopy revealed that the product was in the form of whisker having a length of 10–25 μm and a diameter of 0.2–0.3 μm. The X-ray diffraction pattern of the whisker reveals that the whisker is crystalline β-SiC.

EXAMPLE 3

In 576 parts of styrene were dissolved 100 parts of polycarbosilane (the same as used in Example 1) and the resulting solution was placed in a polyethylene vessel together with 64 parts of TMPT, 100 parts of chopped carbon fiber (derived from pitch, manufactured by Donac Inc.), 6.4 parts of BPO and 960 parts of petroleum resin (C5-type resin HILETS T-100X manufactured by Mitsui Petrochemical Inc.). The contents in the vessel were then thoroughly mixed with a stirrer. The mixture was processed in the same manner as that in Example 1 except that the pyrolysis temperature was decreased to 1,250° C. The scanning electric microscopy revealed that the product was in the form of whisker having a length of 10–15 μm and a diameter of 0.4–0.6 μm. The X-ray diffraction pattern of the whisker reveals that the whisker is crystalline β-SiC.

EXAMPLE 4

In 144 parts of styrene were dissolved 100 parts of polycarbosilane (the same as used in Example 1) and the resulting solution was placed in a polyethylene vessel together with 16 parts of TMPT, 470 parts of milled carbon fiber (the same as used in Example 1) and 40 parts of an emulsifier (sorbitan sesquioleate, hereinafter referred to as SSO). The contents in the vessel were then thoroughly mixed with a stirrer, to which a solution of 1.6 parts of ammonium persulfate (hereinafter referred to as APS) dissolved in 470 parts of water was gradually mixed with stirring and thereafter vigorously stirred to obtain a stable W/O emulsion. The emulsion was then poured into a tubular glass vessel and heated at 60° C. for 24 hours to polymerize the styrene and TMPT and to obtain a solid body in a columnar shape. The solid body was taken out of the vessel and dried at 60° C. to obtain a porous body.

The porous body was then placed in a degreasing chamber. While continuously feeding nitrogen gas to the chamber at a rate of 1 liter per minute, the solid body was gradually heated to 550° C. and maintained at that temperature for 4 hour to decompose the APS, the polymer of styrene and TMPT and emulsifier. The resulting product was placed in an oven. While argon was continuously fed to the oven at a rate of 0.5 liter per minute, the pretreated product was pyrolyzed at 1,300° C. for 5 hours. The pyrolyzed product was then heated at 650° C. for 4 hours in air to burn the carbon fiber to leave a light green product. The scanning electric microscopy revealed that the product was in the form of whisker having a length of 10–25 μm and a diameter of 0.2–0.4 μm. The X-ray diffraction pattern of the whisker reveals that the whisker is crystalline β-SiC.

EXAMPLE 5

In 288 parts of styrene were dissolved 100 parts of polysilastyrene (the same as used in Example 2) and the resulting solution was placed in a polyethylene vessel together with 32 parts of TMPT, 520 parts of milled carbon fiber (the same as used in Example 4) and 80 parts of SSO. The contents in the vessel were then thoroughly mixed with a stirrer, to which a Solution of 3.2 parts of APS dissolved in 1,000 parts of water was gradually mixed with stirring and thereafter vigorously stirred to obtain a stable W/O emulsion. The emulsion was processed in the same manner as that in Example 4 except that the pyrolysis temperature was increased to 1,500° C. The scanning electric microscopy revealed that the product was in the form of whisker having a length of 10–15 μm and a diameter of 0.3–0.6 μm. The X-ray diffraction pattern of the whisker reveals that the whisker is crystalline β-SiC.

EXAMPLE 6

In 288 parts of styrene were dissolved 100 parts of polycarbosilane (the same as used in Example 4) and the resulting solution was placed in a polyethylene vessel together with 32 parts of TMPT, 480 parts of milled carbon fiber (the same as used in Example 4) and 80 parts of SSO. The contents in the vessel were then thoroughly mixed with a stirrer, to which a solution of 3.2 parts APS dissolved in 3,700 parts of water was gradually mixed with stirring and thereafter vigorously stirred to obtain a stable W/O emulsion. The emulsion was processed in the same manner as that in Example 4 except that the pyrolysis temperature was increased to 1,400° C. The scanning electric microscopy revealed that the product was in the form of whisker having a length of 20–30 μm and a diameter of 0.2–0.4 μm. The X-ray diffraction pattern of the whisker reveals that the whisker is crystalline β-SiC.

COMPARATIVE EXAMPLE 1

Example 4 was repeated in the same manner as described except that no carbon fiber was used. The scanning electric microscopy revealed no production of whiskers. The X-ray diffraction pattern of the product shows broad peaks at 2θ of 35.7°, 41.5°, 60.0°, 71.8° and 75.5°, indicating that the presence of amorphous β-SiC.

EXAMPLE 7

In a polyethylene vessel were placed 100 parts of polycarbosilane (the same as used in Example 1) and 500 parts of chloroform and the mixture was stirred to completely dissolve the polycarbosilane. Then, 250 parts of milled carbon fiber (the same as used in Example 1) were added into the solution and vigorously stirred. The mixture was maintained at 60° C. for 24 hours to vaporize the chloroform and to obtain a porous body in the form of a plate.

The porous body was then placed in an oven. While continuously feeding argon to the oven at a rate of 0.5 liter per minute, the porous body was pyrolyzed at 1,350° C. for 5 hours. The pyrolyzed product was then heated at 650° C. for 4 hours in air to burn the carbon fiber to leave a light green product. The scanning electric microscopy revealed that the product was in the form of whisker having a length of 10–25 μm and a diameter of 0.3–0.6 μm. The X-ray diffraction pattern of the whisker reveals that the whisker is crystalline β-SiC.

EXAMPLE 8

In a polyethylene vessel were placed 100 parts of polysilastyrene (the same as used in Example 2) and 500 parts of chloroform and the mixture was stirred to completely dissolve the polysilastyrene. Then, 500 parts of milled carbon fiber (the same as used in Example 7) were added into the solution and vigorously stirred. The mixture was processed in the same manner as described in Example 7 except that the pyrolysis temperature was decreased to 1,250° C. The scanning electric microscopy revealed that the product was in the form of whisker having a length of 10–20 μm and a diameter of 0.2–0.4 μm. The X-ray diffraction pattern of the whisker reveals that the whisker is crystalline β-SiC.

EXAMPLE 9

Example 7 was repeated in the same manner as described except that the amount of the milled carbon fiber was increased to 500 parts. The scanning electric microscopy revealed that the product was in the form of whisker having a length of 10–25 μm and a diameter of 0.3–0.7 μm. The X-ray diffraction pattern of the whisker reveals that the whisker is crystalline β-SiC.

EXAMPLE 10

In 900 parts of styrene were dissolved 100 parts of polycarbosilane (the same as used in Example 1) and 400 parts of polystyrene and the resulting solution was placed in a polyethylene vessel together with 100 parts of TMPT, 500 parts of milled carbon fiber (the same as used in Example 1) and 10 parts of BPO. The contents in the vessel were then thoroughly mixed with a stirrer. The mixture was then poured into a tubular glass vessel and heated at 60° C. for 24 hours to polymerize the styrene and TMPT and to obtain a solid body in a columnar shape.

Figure 2:
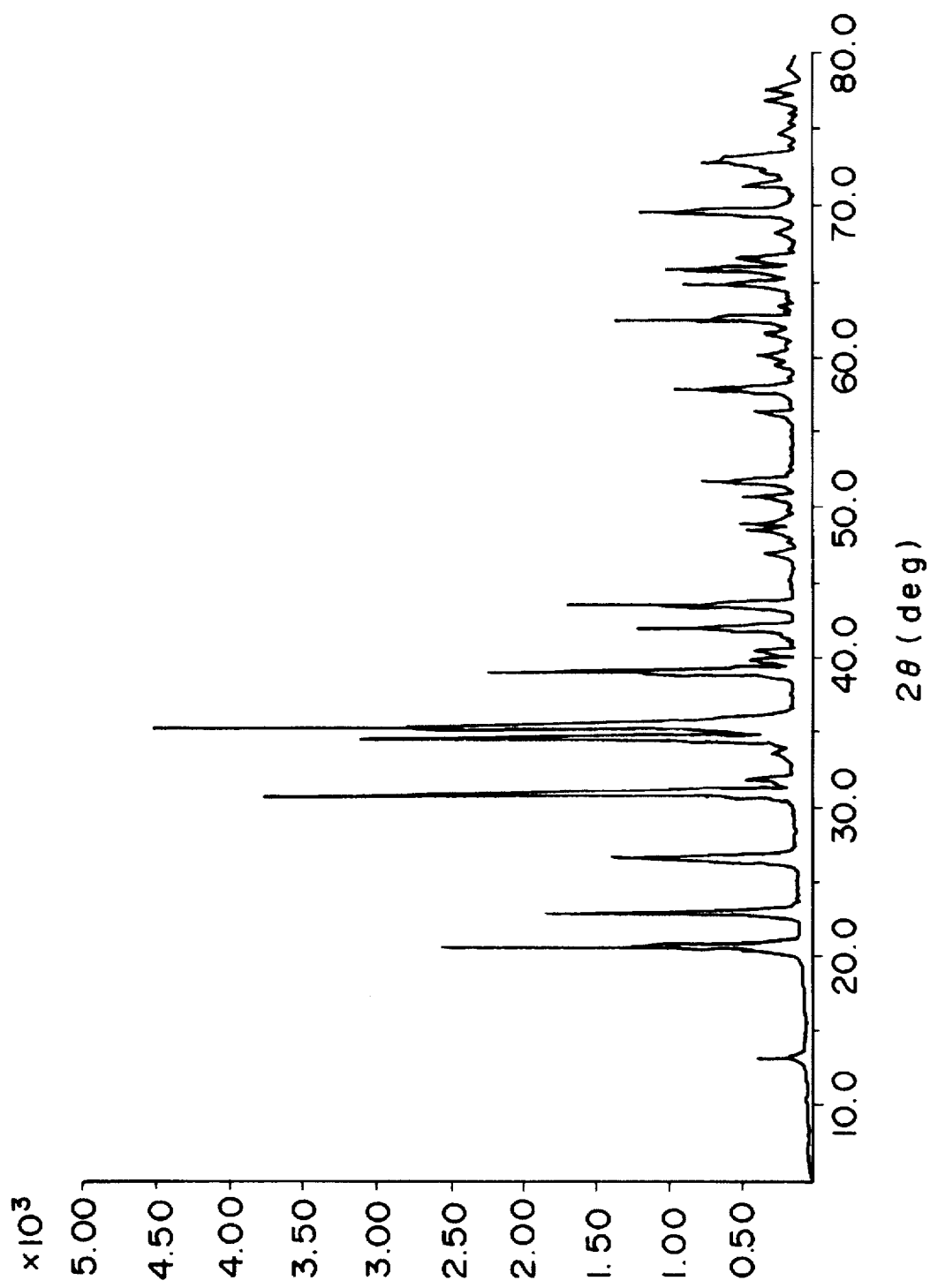
FIG. 2 is a powder X-ray diffraction pattern of silicon nitride whisker obtained in Example 10.

The solid body was taken out of the vessel and placed in a degreasing chamber. While continuously feeding nitrogen gas to the chamber at a rate of 1 liter per minute, the solid body was gradually heated to 550° C. and maintained at that temperature for 4 hours to decompose the APS and the polymer of styrene and TMPT. The resulting product was placed in an oven. While nitrogen gas was continuously fed to the oven at a rate of 1 liter per minute, the pretreated product was pyrolyzed at 1,350° C. for 5 hours. The pyrolyzed product was then heated at 650° C. in air to burn the carbon fiber to leave a grayish white product. The scanning electric microscopy revealed that the product was in the form of whisker having a length of 10–30 μm and a diameter of 0.3–0.9 μm. The X-ray diffraction pattern of the whisker is shown in FIG. 2, from which the whisker is identified as being crystalline α-$Si_3N_4$.

EXAMPLE 11

In 900 parts of styrene were dissolved 100 parts of polysilastyrene (the same as used in Example 2) and 400 parts of polystyrene and the resulting solution was placed in a polyethylene vessel together with 100 parts of TMPT, 50 parts of felt carbon fiber (derived from pitch, manufactured by Donac Inc.), 10 parts of BPO. The contents in the vessel were then thoroughly mixed with a stirrer. The mixture was processed in the same manner as that in Example 10. The scanning electric microscopy revealed that the product was in the form of whisker having a length of 10–40 μm and a diameter of 0.5–1.5 μm. The X-ray diffraction pattern of the whisker reveals that the whisker is crystalline α-$Si_3N_4$.

EXAMPLE 12

In 576 parts of styrene were dissolved 100 parts of polycarbosilane (the same as used in Example 10) and the resulting solution was placed in a polyethylene vessel together with 64 parts of TMPT, 100 parts of chopped carbon fiber (the same as used in Example 3), 6.4 parts of BPO and 960 parts of petroleum resin (the same as used in Example 3). The contents in the vessel were then thoroughly mixed with a stirrer. The mixture was processed in the same manner as that in Example 10 except that the pyrolysis temperature was increased to 1,450° C. The scanning electric microscopy revealed that the product was in the form of whisker having a length of 30–50 μm and a diameter of 0.8–2.0 μm. The X-ray diffraction pattern of the whisker reveals that the whisker is crystalline α-$Si_3N_4$.

EXAMPLE 13

In 270 parts of styrene were dissolved 100 parts of polycarbosilane (the same as used in Example 1) and the resulting solution was placed in a polyethylene vessel together with 30 parts of TMPT, 470 parts of milled carbon fiber (the same as used in Example 1) and 75 parts of SSO. The contents in the vessel were then thoroughly mixed with a stirrer, to which a solution of 3 parts of APS dissolved in 940 parts of water was gradually mixed with stirring and thereafter vigorously stirred to obtain a stable W/O emulsion. The emulsion was then poured into a tubular glass vessel and heated at 60° C. for 24 hours to polymerize the styrene and TMPT and to obtain a solid body in a columnar shape. The solid body was taken out of the vessel and dried at 60° C. to obtain a porous body.

The porous body was then placed in a degreasing chamber. While continuously feeding nitrogen gas to the chamber at a rate of 1 liter per minute, the solid body was gradually heated to 550° C. and maintained at that temperature for 4 hours to decompose the APS, the polymer of styrene and TMPT and emulsifier. The resulting product was placed in an oven. While nitrogen gas was continuously fed to the oven at a rate of 1 liter per minute, the pretreated product was pyrolyzed at 1,400° C. for 5 hours. The pyrolyzed product was then heated at 650° C. for 4 hours in air to burn the carbon fiber to leave a grayish white product. The scanning electric microscopy revealed that the product was in the form of whisker having a length of 10–20 μm and a diameter of 0.3–0.6 μm. The X-ray diffraction pattern of the whisker reveals that the whisker is crystalline α-$Si_3N_4$.

EXAMPLE 14

In 270 parts of styrene were dissolved 100 parts of polysilastyrene (the same as used in Example 2) and the resulting solution was placed in a polyethylene vessel together with 30 parts of TMPT, 470 parts of milled carbon fiber (the same as used in Example 13) and 75 parts of SSO. The contents in the vessel were then thoroughly mixed with a stirrer, to which a solution of 3 parts of APS dissolved in 560 parts of water was gradually mixed with stirring and thereafter vigorously stirred to obtain a stable W/O emulsion. The emulsion was processed in the same manner as that in Example 13 except that the pyrolysis temperature was decreased to 1,300° C. The scanning electric microscopy revealed that the product was in the form of whisker having a length of 10–40 μm and a diameter of 0.3–0.9 μm. The X-ray diffraction pattern of the whisker reveals that the whisker is crystalline α-$Si_3N_4$.

EXAMPLE 15

In 266 parts of styrene were dissolved 100 parts of polycarbosilane (the same as used in Example 13) and the resulting solution was placed in a polyethylene vessel together with 30 parts of TMPT, 480 parts of milled carbon fiber (the same as used in Example 13) and 74 parts of SSO. The contents in the vessel were then thoroughly mixed with a stirrer, to which a solution of 3 parts APS dissolved in 556 parts of water was gradually mixed with stirring and thereafter vigorously stirred to obtain a stable W/O emulsion. The emulsion was processed in the same manner as that in Example 13 except that the pyrolysis temperature was increased to 1,500° C. The scanning electric microscopy revealed that the product was in the form of whisker having a length of 20–40 μm and a diameter of 0.3–0.8 μm. The X-ray diffraction pattern of the whisker reveals that the whisker is crystalline α-$Si_3N_4$.

COMPARATIVE EXAMPLE 2

Example 13 was repeated in the same manner as described except that no carbon fiber was used. The scanning electric microscopy revealed no whiskers within the product and trace wool ball-like whiskers on the surface of the product.

COMPARATIVE EXAMPLE 3

Polycarbosilane (the same as used in Example 13) was pyrolyzed at 1,400° C. for 5 hours while continuously feeding nitrogen gas. The scanning electric microscopy revealed no whiskers.

EXAMPLE 16

In a polyethylene vessel were placed 100 parts of polysilastyrene (the same as used in Example 2) and 1,000 parts of chloroform and the mixture was stirred to completely dissolve the polysilastyrene. Then, 500 parts of milled carbon fiber (the same as used in Example 1) were added into the solution and vigorously stirred. The mixture was maintained at 60° C. for 24 hours to vaporize the chloroform and to obtain a porous body in the form of a plate.

The porous body was then placed in an oven. While continuously feeding nitrogen gas to the oven at a rate of 1 liter per minute, the porous body was pyrolyzed at 1,350° C. for 5 hours. The pyrolyzed product was then heated at 650° C. for 4 hours in air to burn the carbon fiber to leave a grayish white product. The scanning electric microscopy revealed that the product was in the form of whisker having a length of 25–40 μm and a diameter of 0.5–1.5 μm. The X-ray diffraction pattern of the whisker reveals that the whisker is crystalline α-$Si_3N_4$.

EXAMPLE 17

In a polyethylene vessel were placed 100 parts of polycarbosilane (the same as used in Example 1) and 1,000 parts of chloroform and the mixture was stirred to completely dissolve the polycarbosilane. Then, 500 parts of milled carbon fiber (the same as used in Example 16) were added into the solution and vigorously stirred. The mixture was processed in the same manner as described in Example 16 except that the pyrolysis temperature was increased to 1,450° C. The scanning electric microscopy revealed that the product was in the form of whisker having a length of 15–25 μm and a diameter of 0.5–1.0 μm. The X-ray diffraction pattern of the whisker reveals that the whisker is crystalline α-$Si_3N_4$.

EXAMPLE 18

Example 17 was repeated in the same manner as described except that the amount of the milled carbon fiber was decreased to 250 parts and that the pyrolysis temperature was decreased to 1,350° C. The scanning electric microscopy revealed that the product was in the form of whisker having a length of 10–20 μm and a diameter of 0.5–1.0 μm. The X-ray diffraction pattern of the whisker reveals that the whisker is crystalline α-$Si_3N_4$.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A process for the production of silicon-containing ceramic whiskers, comprising the steps of:

(a) forming a solid body of a mixture including an organosilicon polymer having a number average molecular weight of 500–50,000 and having a skeleton consisting of silicon atoms or silicon atoms and carbon atoms, and carbon; and (b) pyrolyzing said solid body in a noble gas atmosphere or a nitrogen gas atmosphere to form silicon-containing ceramic whiskers.

2. A process as claimed in claim 1, wherein said organosilicon polymer is a polysilane or a polycarbosilane.

3. A process as claimed in claim 1, wherein said carbon is fibrous carbon.

4. A process as claimed in claim 1, wherein said carbon is present in an amount of 20–1,000 parts by weight per 100 parts by weight of the organosilicon polymer.

5. A process as claimed in claim 1, wherein step (b) is performed in the noble gas atmosphere at a temperature of 1,100°–1,550° C. to produce silicon carbide whiskers.

6. A process as claimed in claim 1, wherein step (b) is performed in the nitrogen gas atmosphere at a temperature of 1,100°–1,600° C. to produce silicon nitride whiskers.

7. A process as claimed in claim 1, wherein said solid body is a porous body.

8. A process as claimed in claim 1, wherein step (a) comprises the sub-steps of:

providing a blend containing said organosilicon polymer, said carbon, a vinyl group-containing polymerizable compound and a polymerization initiator, and polymerizing said polymerizable compound.

9. A process as claimed in claim 8, wherein said polymerizable compound is a liquid capable of dissolving said organosilicon polymer therein.

10. A process as claimed in claim 9, wherein said polymerizable compound is a styrene compound.

11. A process as claimed in claim 1, wherein step (a) comprises the sub-steps of:

providing a W/O emulsion containing said organosilicon polymer, said carbon, a vinyl group-containing polymerizable compound, a polymerization initiator, an emulsifier and water, polymerizing said polymerizable compound, and evaporating said water from said polymerized product.

12. A process as claimed in claim 11, wherein said polymerizable compound is a liquid capable of dissolving said organosilicon polymer therein.

13. A process as claimed in claim 12, wherein said polymerizable compound is a styrene compound.

14. A process as claimed in claim 1, wherein step (a) comprises the sub-steps of:

dissolving said organosilicon polymer in a solvent to obtain a solution, blending said solution with said carbon to obtain a blend, and removing said solvent from said blend.

15. A process as claimed in claim 1, wherein step (a) comprises the sub-steps of:

providing a blend containing said organosilicon polymer, said carbon and a thermoplastic resin binder, heating said blend to fuse said binder, and then cooling said blend to solidify said binder.

16. A process as claimed in claim 1, wherein step (a) comprises the sub-steps of:

providing a blend containing said organosilicon polymer, said carbon and an aqueous solution of a water-soluble binder, and drying said blend to remove said water.

* * * * *